US010593850B2

(12) United States Patent
Chae et al.

(10) Patent No.: US 10,593,850 B2
(45) Date of Patent: Mar. 17, 2020

(54) METHOD FOR MANUFACTURING LIGHT EMITTING DIODE PACKAGE

(71) Applicant: SEOUL VIOSYS CO., LTD., Ansan-si (KR)

(72) Inventors: Jong Hyeon Chae, Ansan-si (KR); Yeon Cheol Cho, Ansan-si (KR); Cun Bok Jeong, Ansan-si (KR); Hyoung Jin Lim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 143 days.

(21) Appl. No.: 15/868,976

(22) Filed: Jan. 11, 2018

(65) Prior Publication Data

US 2018/0138382 A1 May 17, 2018

Related U.S. Application Data

(63) Continuation of application No. PCT/KR2016/007645, filed on Jul. 14, 2016.

(30) Foreign Application Priority Data

Jul. 15, 2015 (KR) .......................... 10-2015-0100671
Jul. 11, 2016 (KR) .......................... 10-2016-0087556

(51) Int. Cl.
*H01L 33/62* (2010.01)
*H01L 33/36* (2010.01)
*H01L 33/38* (2010.01)

(52) U.S. Cl.
CPC .............. *H01L 33/62* (2013.01); *H01L 33/36* (2013.01); *H01L 33/382* (2013.01);
(Continued)

(58) Field of Classification Search
CPC ....... H01L 33/62; H01L 33/382; H01L 33/387; H01L 33/36; H01L 2224/16225; H01L 2933/0066; H01L 2933/0016
See application file for complete search history.

(56) References Cited

U.S. PATENT DOCUMENTS

2004/0152238 A1* 8/2004 Maeda .................... H01L 24/81
438/108
2013/0330879 A1* 12/2013 Maki ................... H01L 21/6836
438/107

FOREIGN PATENT DOCUMENTS

JP     2003-338640 A    11/2003
JP        4141549 B2     8/2008
(Continued)

OTHER PUBLICATIONS

International Search Report in PCT/KR2016/007645, dated Oct. 16, 2017.

*Primary Examiner* — Mohammed R Alam
(74) *Attorney, Agent, or Firm* — Perkins Coie LLP

(57) ABSTRACT

A method for manufacturing a light emitting diode package comprises: arranging a first solder and a second solder between a substrate and a light emitting diode; and subjecting the first solder and the second solder to heat treatment to bond the substrate and the light emitting diode. The heat treatment comprises: increasing the temperature of the first and second solders from room temperature to a temperature Tp; maintaining the temperature Tp; and lowering the temperature Tp. The heating step comprises: a first ramping step of increasing a temperature from room temperature to a temperature $T_A$ at a constant speed; a pre-heating step of increasing the temperature from the temperature $T_A$ to a temperature $T_B$ to impart fluidity to the first and second solders; and a second ramping step of increasing the temperature from the $T_B$ to $T_L$ at a constant speed.

17 Claims, 20 Drawing Sheets

(52) U.S. Cl.
CPC .. *H01L 33/387* (2013.01); *H01L 2224/16225* (2013.01); *H01L 2933/0016* (2013.01); *H01L 2933/0066* (2013.01)

(56) References Cited

FOREIGN PATENT DOCUMENTS

| | | |
|---|---|---|
| JP | 2009-004716 A | 1/2009 |
| JP | 2014-067782 A | 4/2014 |
| KR | 10-2012-0048330 A | 5/2012 |

\* cited by examiner

METHOD FOR MANUFACTURING LIGHT EMITTING DIODE PACKAGE

CROSS-REFERENCE TO RELATED APPLICATION(S)

This patent document claims priority to and the benefit of Korean Patent Application Nos. 10-2015-0100671, filed on Jul. 15, 2015, 10-2016-0087556, filed on Jul. 11, 2016, and an International Application No. PCT/KR2016/007645, filed on Jul. 14, 2016, which are all hereby incorporated by reference for all purposes as if fully set forth herein.

TECHNICAL FIELD

Exemplary embodiments described in the present document relate to a method of manufacturing a light emitting diode package. Some implementations of the disclosed technology relate to conditions for mounting a light emitting diode on a substrate.

BACKGROUND

A light emitting diode (LED) refers to a solid-state device that emits light through conversion of electric energy. The light emitting diode is broadly applied to various light sources for backlight units, lighting, signal boards, large displays, and the like, and can be used in the form of a light emitting diode package including a circuit board, an encapsulation material, and the like.

SUMMARY

Exemplary embodiments of the present disclosure provide a method of manufacturing a light emitting diode package, which has a low failure rate.

An exemplary embodiment of the present disclosure provides a method of manufacturing a light emitting diode package including: disposing a first solder and a second solder between a first connection pad of a substrate and a first pad electrode of a light emitting diode and between a second connection pad of the substrate and a second pad electrode of the light emitting diode, respectively; and subjecting the first and second solders to heat treatment to bond the substrate to the light emitting diode, wherein the heat treatment of the first and second solders includes: heating the first and second solders from room temperature to a temperature Tp; maintaining the first and second solders at the temperature Tp; and cooling the first and second solders from the temperature Tp, and wherein heating the first and second solders includes a first ramping step in which a temperature of the first and second solders is raised from room temperature to a temperature $T_A$ at a constant heating rate; a preheating step in which the temperature of the first and second solders is raised from the temperature $T_A$ to a temperature $T_B$ to impart flowability to the first and second solders; and a second ramping step in which the temperature of the first and second solders is raised from the temperature $T_B$ to a temperature $T_L$ at a constant heating rate, and the preheating step is performed for 60 seconds to 180 seconds.

The preheating step may include a preheating zone in which a heating rate varies over time. The preheating step may also include a section in which the heating rate is constant.

In the preheating step, the temperature may be raised within a temperature range of 150 degrees Celsius to 200 degrees Celsius. For example, the temperature $T_A$ may be 150 degrees Celsius and the temperature $T_B$ may be 200 degrees Celsius.

The temperature $T_p$ may be 300 degrees Celsius or less. More specifically, the temperature $T_p$ may be 260 degrees Celsius.

The method may further include soldering the first and second solders to impart adhesion to the first and second solders after the second ramping step, wherein soldering the first and second solders may be independently performed in the step of raising the temperature of the first and second solders from the temperature $T_L$ to the temperature $T_p$ upon heating the first and second solders, in the step of maintaining the first and second solders at the temperature Tp, and in the step of cooling the first and second solders.

In the step of raising the temperature of the first and second solders from the temperature $T_L$ to the temperature $T_p$, the temperature of the first and second solders may be raised at a rate of 3° C./s or less, and, in the step of cooling the first and second solders, the temperature of the first and second solders may be lowered at a rate of 6° C./s or less upon soldering the first and second solders.

Soldering the first and second solders may be performed in a temperature range of 217 degrees Celsius to 260 degrees Celsius for 88 seconds to 90 seconds. Each of the first solder and the second solder may include 1% to 1.4% of Ag based on the total mass of the first solder and the second solder.

Disposing the first solder and the second solder may include disposing a mask having a first exposure region and a second exposure region exposing the first connection pad and the second connection pad on the substrate, respectively, and disposing the first and second solders in the first exposure region and the second exposure region of the mask, respectively.

The mask may have a thickness of 0.08 mm to 0.18 mm.

Each of the first exposure region and the second exposure region may have an area of 80% to 110% of an upper surface area of each of the first connection pad and the second connection pad.

A center of each of the first exposure region and the second exposure region may overlap a center of each of the first connection pad and the second connection pad in a vertical direction.

An amount of each of the first solder and the second solder may be 100% to 150% of a reference solder amount, and the reference solder amount may be a volume according to the following Equation 1.

$$\text{Reference solder amount (mm}^3\text{)} = (\text{upper surface area of first exposure region (mm}^2\text{) and upper surface area of second exposure region (mm}^2\text{))} \times 0.08 \text{ mm} \quad \text{Equation 1}$$

In one exemplary embodiment, the substrate may include a groove disposed between the first connection pad and the second connection pad to be parallel to the first connection pad and the second connection pad, and the groove may be formed by partially indenting an upper surface of the substrate.

In one exemplary embodiment, the substrate may include at least one hole disposed between the first connection pad and the second connection pad and formed through the substrate from an upper surface of the substrate to a lower surface thereof. In another exemplary embodiment, the substrate may include both the groove and the hole.

The method of manufacturing a light emitting diode package may further include manufacturing a light emitting diode including the first pad electrode and the second pad electrode, wherein manufacturing the light emitting diode includes: forming a light emitting structure on a growth substrate, the light emitting structure including a first conductivity type semiconductor layer, a second conductivity type semiconductor layer, and an active layer interposed between the first conductivity type semiconductor layer and the second conductivity type semiconductor layer; forming a first contact electrode and a second contact electrode to form ohmic contact with the first conductivity type semiconductor layer and the second conductivity type semiconductor layer, respectively; forming an insulation layer insulating the first contact electrode and the second contact electrode from each other while partially covering the first contact electrode and the second contact electrode; and forming a first pad electrode and a second pad electrode on the insulation layer to be electrically connected to the first contact electrode and the second contact electrode, respectively. The second contact electrode may include Ag.

According to exemplary embodiments of the present disclosure, the manufacturing method can prevent the occurrence of short circuit in a light emitting diode package by sufficiently removing a solvent from a solder. As a result, it is possible to reduce a failure rate of the light emitting diode package.

DETAILED DESCRIPTION

Figure 1:
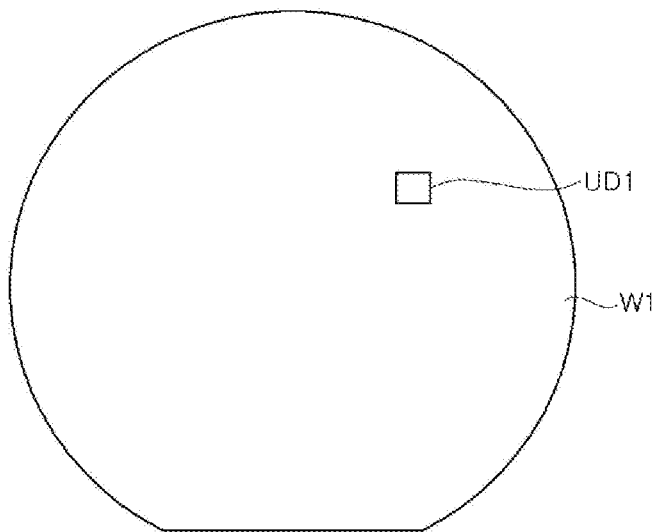
FIGS. 1, 2A, 2B, 3A, 3B, 4A, 4B, 5A, 5B, 6A, 6B, 7A, 7B, 8A, 8B, 9A, 9B, 10A, 10B, 11, 12A, 12B, 13A, 13B, 14A, 14B, 15, 16 and FIG. 17 are plan views cross-sectional views and a graph illustrating a method of manufacturing a light emitting diode package according to one exemplary embodiment disclosed in the present document.

Hereinafter, exemplary embodiments of the disclosed technology will be described in detail with reference to the accompanying drawings. The present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

The light emitting diode (LED) can be mounted on a circuit board via a solder. In this case, short circuit between an anode and a cathode can occur due to a solvent in the solder, thereby causing damage to the light emitting diode package. The disclosed technology provides techniques that provide optimal conditions for mounting the light emitting diode on the circuit board via the solder in order to solve such a problem.

FIGS. 1, 2A, 2B, 3A, 3B, 4A, 4B, 5A, 5B, 6A, 6B, 7A, 7B, 8A, 8B, 9A, 9B, 10A, 10B, 11, 12A, 12B, 13A, 13B, 14A, 14B, 15, 16 and FIG. 17 are plan views, cross-sectional views and graphs illustrating a method of manufacturing a light emitting diode package according to one exemplary embodiment of the present disclosure. In these views, a cross-sectional view shown in B is taken along line A-A' of a plan view shown in A. Although FIGS. 1, 2A, 2B, 3A, 3B, 4A, 4B, 5A, 5B, 6A, 6B, 7A, 7B, 8A, 8B, 9A, 9B, 10A, 10B, 11, 12A, 12B, 13A, 13B, 14A, 14B, 15, 16 and FIG. 17 will be referred to in description of the method of manufacturing a light emitting diode package according to the exemplary embodiment, it is noted that the manufacturing method according to the exemplary embodiment is not restricted to sequences of these figures.

Figure 2A:
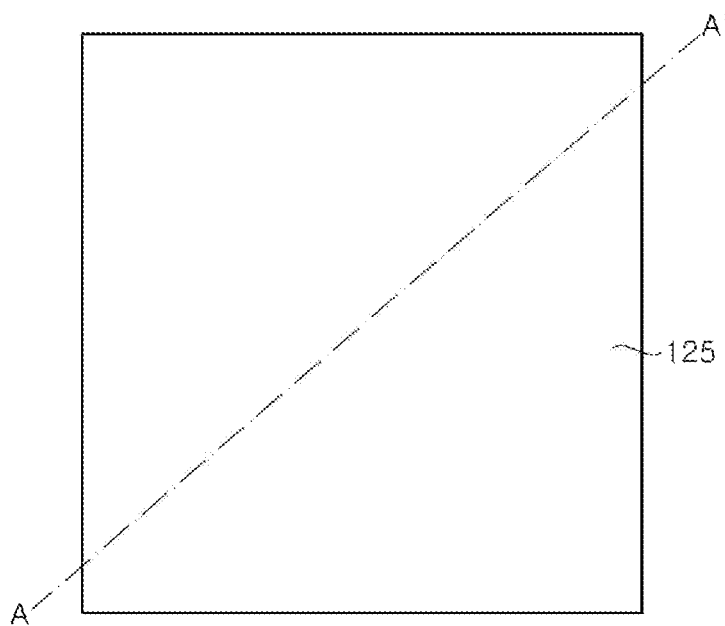
Figure 2B:
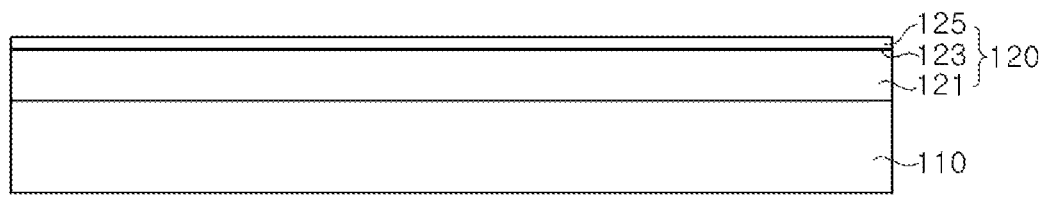

First, referring to FIGS. 1, 2A and 2B, a wafer W1 is prepared by forming a light emitting structure 120 on a growth substrate 110.

Referring to FIG. 1, the wafer W1 may include the growth substrate 110 and the light emitting structure 120 grown on the growth substrate 110. In addition, a plurality of light emitting diodes may be manufactured from a single wafer W1. Thus, the wafer W1 may include a plurality of unit diode regions UD1. For convenience, the method of manufacturing a light emitting diode will be described for one unit diode region UD1 with reference to FIGS. 2A, 2B, 3A, 3B, 4A, 4B, 5A, 5B, 6A, 6B, 7A, 7B, 8A, 8B, 9A, 9B, 10A, 10B, 11, 12A, 12B, 13A, 13B, 14A, 14B, 15, 16 and 17. The method according to this exemplary embodiment can be applied to the entirety of the wafer W1 including the plurality of unit diode regions UD1.

Referring to FIG. 2A and FIG. 2B, the light emitting structure 120 including a first conductivity type semiconductor layer 121, an active layer 123 and a second conductivity type semiconductor layer 125 is formed on the growth substrate 110.

The growth substrate 110 may be or include any substrate that allows growth of the light emitting structure 120 thereon. For example, the growth substrate 110 may be or include a sapphire substrate, a silicon carbide substrate, a silicon substrate, a gallium nitride substrate, an aluminum nitride substrate, or the like. In addition, the substrate 110 may include a roughness pattern on an upper surface thereof. The growth substrate 110 may be removed from the light emitting diode by a separate process.

The light emitting structure 120 may be grown on the growth substrate 110 by suitable techniques, for example, metal organic chemical vapor deposition (MOCVD), hydride vapor phase epitaxy (HVPE), molecular beam epitaxy (MBE), or others. The light emitting structure 120 includes the first conductivity type semiconductor layer 121, the active layer 123, and the second conductivity type semiconductor layer 125. Each of the first conductivity type semiconductor layer 121, the active layer 123 and the second conductivity type semiconductor layer 125 may include Group III-V compound semiconductors, for example, nitride-based semiconductors such as (Al, Ga, In)N. The first conductivity type semiconductor layer 121 includes n-type dopants (for example, Si) to exhibit n-type conductivity and the second conductivity type semiconductor layer 125 includes p-type dopants (for example, Mg) to exhibit p-type conductivity, or vice versa. The active layer 123 may have a multi-quantum well (MQW) structure and the composition of the active layer may be determined so as to emit light having desired wavelengths. For example, the active layer 123 may be configured to emit light having a peak wavelength in the UV wavelength band or in the blue light wavelength band.

Figure 3A:
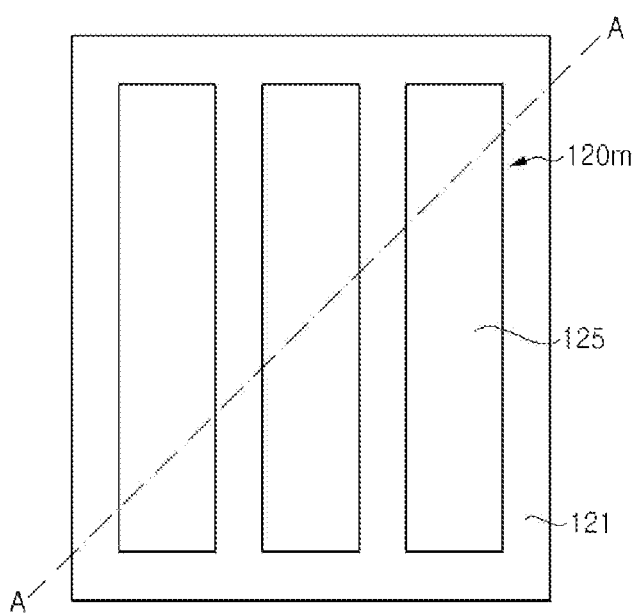
Figure 3B:
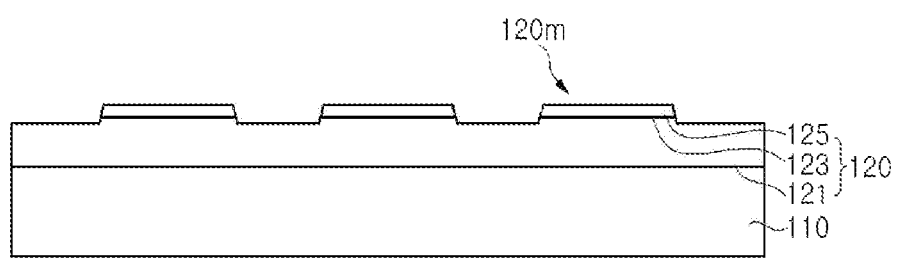

Referring to FIG. 3A and FIG. 3B, a partially exposed region of the first conductivity type semiconductor layer 121 is formed by patterning the light emitting structure 120. For example, at least one mesa 120m is formed to form a region in which the first conductivity type semiconductor layer 121 is partially exposed, as shown in FIG. 3A and FIG. 3B.

The mesa 120m may be formed by partially removing the second conductivity type semiconductor layer 125 and the active layer 123 through photolithography and etching. The mesa 120m may include the second conductivity type semiconductor layer 125 and the active layer 123. The first conductivity type semiconductor layer 121 may be partially exposed around the mesa 120m. For example, although the shape of the mesa 120m is not particularly limited, the mesa 120m may have an elongated shape extending substantially in the same direction, as shown in FIG. 3A, and may include a plurality of mesas. Here, the plural mesas 120m are spaced apart from one another.

Figure 4A:
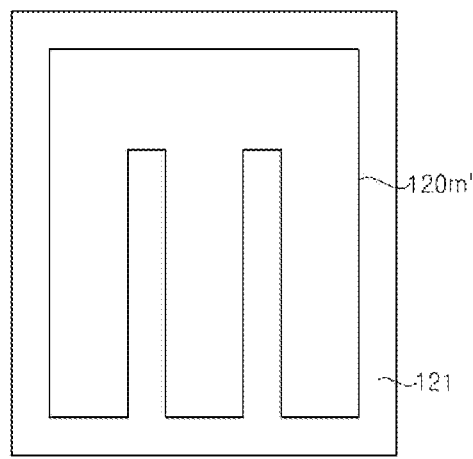
Figure 4B:
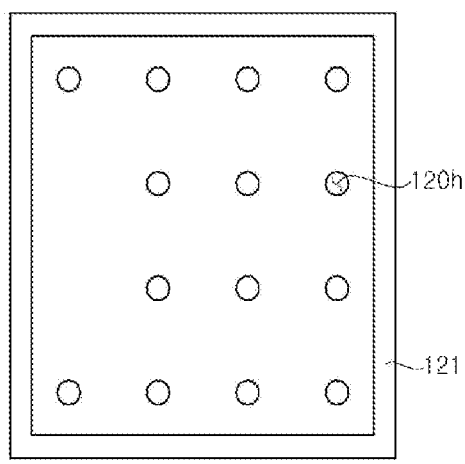

Alternatively, as shown in FIGS. 4A and 4B, the mesa 120m' may have an integral structure and may have an indented portion along one side surface of the mesa 120m'. For example, as shown in FIG. 4A, the mesa 120m' may have different regions including a first region in which the mesa 120m' is continuously formed on the first conductivity type semiconductor layer 121 and a second region in which the mesa 120m' is formed on separate regions of the first conductivity type semiconductor layer 121. In a plan view, the mesa 120m' has a flat side and a non-flat side. The flat side of the mesa 120m' is located near one side of the growth substrate 110 and separated from the side of the growth substrate 110 by a same distance along the first side of the mesa 120m'. The non-flat side of the mesa 120m' is opposite to the side of the growth substrate 110 and separated from the side of the growth substrate 110 by different distances along the second side. The first conductivity type semiconductor layer 121 may be partially exposed through the separated regions. The mesa 120m may include plural separated regions, for example, two regions as shown in FIG. 4A, or at least three regions. Alternatively, as shown in FIG. 4B, the light emitting structure 120 may include at least one hole 120h that partially exposes the first conductivity type semiconductor layer 121. The light emitting structure 120 may include a plurality of holes 120h, which may be regularly arranged.

Figure 5A:
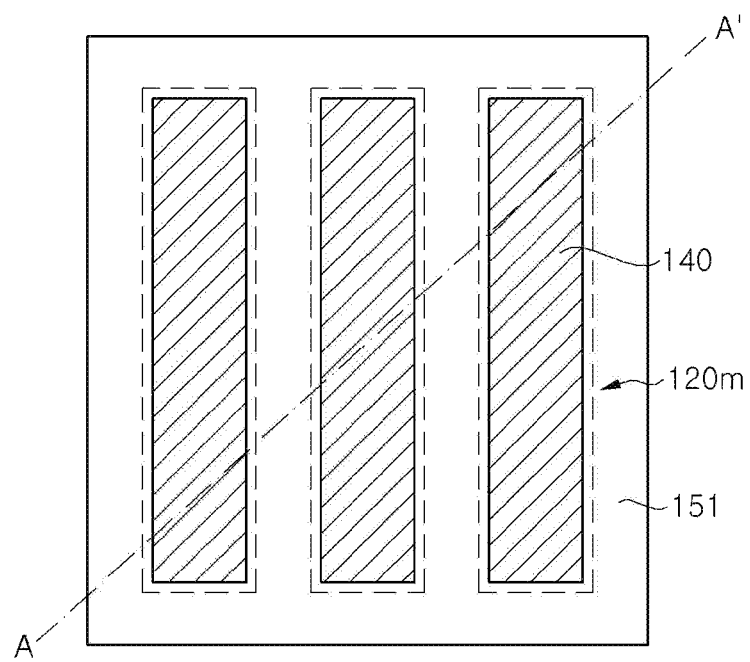
Figure 5B:
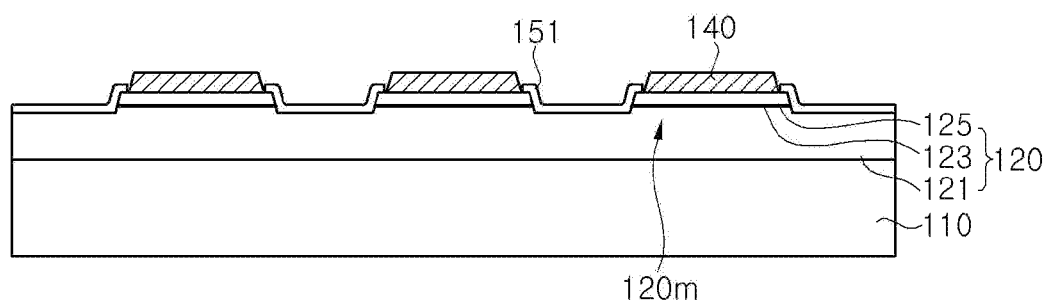

Next, referring to FIGS. 5A and 5B, second contact electrodes 140 are formed on the second conductivity type semiconductor layer 125, for example, on at least part of an upper surface of the mesa 120m. In addition, a pre-first insulating layer 151 may be further formed on the light emitting structure 120.

The second contact electrodes 140 may be formed of a material capable of forming ohmic contact with the second conductivity type semiconductor layer 125, and may include, for example, a metallic material and/or a conductive oxide.

For the second contact electrodes 140 including a metallic material, the second contact electrodes 140 may include a reflective layer and a cover layer covering the reflective layer. As described above, the second contact electrodes 140 serve to reflect light while forming ohmic contact with the second conductivity type semiconductor layer 125. Accordingly, the reflective layer may include a metal that has high reflectivity and can form ohmic contact with the second conductivity type semiconductor layer 125. For example, the reflective layer may include at least one of Ni, Pt, Pd, Rh, W, Ti, Al, Mg, Ag, or Au, or the combination thereof. In addition, the reflective layer may be composed of a single layer or multiple layers.

The cover layer can prevent interdiffusion of materials between the reflective layer and other layers and can prevent external materials from diffusing into and damaging the reflective layer. Accordingly, the cover layer may be formed to cover a lower surface and a side surface of the reflective layer. The cover layer may be electrically connected together with the reflective layer to the second conductivity type semiconductor layer 125 and act as an electrode together with the reflective layer. The cover layer may include, for example, Au, Ni, Ti, Cr, or others, and may be composed of a single layer or multiple layers.

The reflective layer and the cover layer may be formed by e-beam deposition, plating, or others.

The conductive oxide for the second contact electrodes 140 may include ITO, ZnO, AZO, IZO, or others. The second contact electrodes 140 formed of or including the conductive oxide can cover a wider area of an upper surface of the second conductivity type semiconductor layer 125 than the second contact electrode formed of or including a metal. If the second contact electrodes 140 include the conductive oxide, the second contact electrodes 140 is separated from the periphery of the exposed region of the first conductivity type semiconductor layer 121 by a shorter distance as compared to the case when the second contact electrodes 140 include the metal. In this case, it is possible to reduce or shorten a distance from a contact portion between the second contact electrode 140 and the second conductivity type semiconductor layer 125 to a contact portion between a first contact electrode 130 and the first conductivity type semiconductor layer 121, thereby reducing forward voltage Vf of the light emitting diode.

The second contact electrodes 140 are manufactured in different manners depending on whether the second contact electrodes 140 include the conductive oxide or the metallic material. The manufacturing techniques for the second contact electrodes 140 allow to provide the benefits of reducing forward voltage Vf of the light emitting diode by shortening or reducing the distance between the contact portions of the second contact electrode 140 and the second contact electrode 130. For example, since the metallic material is deposited or plated, the second contact electrode 140 is formed at a portion separated by a predetermined distance from the outer periphery of the second conductivity type semiconductor layer 125 (from the outer periphery of the mesa 120m) by a process margin of a mask. On the other hand, after the conductive oxide layer is formed on the entire upper surface of the second conductivity type semiconductor layer 125, the conductive oxide is removed by the same etching process for exposing the first conductivity type semiconductor layer 121. Accordingly, the conductive oxide layer can be formed closer to the outer periphery of the second conductivity type semiconductor layer 125. Here, it should be understood that other implementations are possible.

When the second contact electrode 140 is composed of or includes a transparent electrode such as ITO or ZnO, the first insulating layer 150 may include a distributed Bragg reflector to reflect light emitted from the light emitting structure 120, thereby improving luminous efficacy. When the second contact electrodes 140 include ITO, the first insulating layer 150 includes $SiO_2$ or DBR and the first contact electrode 130 includes a reflective layer such as an Ag layer, an omnidirectional reflector including a stacked structure of $ITO/SiO_2$ (or DBR)/Ag may be formed. Furthermore, the second contact electrode 140 may include both a conductive oxide layer and a metal layer. In this structure, the second contact electrode 140 may include a conductive oxide layer forming ohmic contact with the second conductivity type semiconductor layer 125 and a metal layer disposed on the conductive oxide. Here, the metal layer may be or include a reflective layer having light reflectivity.

The pre-first insulating layer 151 may be formed on the light emitting structure 120 so as to cover at least part of the upper surface of the light emitting structure 120 excluding regions in which the second contact electrodes 140 will be formed. The pre-first insulating layer 151 may cover a region in which the first conductivity type semiconductor layer 121 is exposed, and may also cover side surfaces of the mesas 120m while partially covering upper surfaces of the mesas 120m. The pre-first insulating layer 151 may contact the second contact electrodes 140 or may be spaced apart therefrom. In the structure wherein the pre-first insulating layer 151 is spaced apart from the second contact electrodes 140, the second conductivity type semiconductor layer 125 is partially exposed between the pre-first insulating layer 151 and the second contact electrode 140. The pre-first insulating layer 151 may include $SiO_2$, $SiN_x$, $MgF_2$, or others. Furthermore, the pre-first insulating layer 151 may include a multilayer structure, and may include a distributed Bragg reflector in which material layers having different indices of refraction are alternately stacked one above another.

The pre-first insulating layer 151 may be formed before or after formation of the second contact electrodes 140, or during formation of the second contact electrodes 140. For example, in the structure wherein the second contact electrodes 140 include a conductive oxide layer and a reflective layer including a metal and disposed on the conductive oxide layer, the conductive oxide layer may be formed on the second conductivity type semiconductor layer 125 and the pre-first insulating layer 151 may be formed before formation of the reflective layer. Here, the conductive oxide layer may form ohmic contact with the second conductivity type semiconductor layer 125 and the pre-first insulating layer 151 may have a thickness of about 1,000 Å. In other exemplary embodiments, the pre-first insulating layer 151 may be formed before formation of the second contact electrodes 140. In this exemplary embodiment, the second contact electrodes 140 may form ohmic contact with the second conductivity type semiconductor layer 125 and may include a reflective layer formed of a metallic material. In these exemplary embodiments, the pre-first insulating layer 151 is formed before formation of the reflective layer including the metallic material, thereby preventing reduction in reflectivity and increase in resistance of the reflective layer due to interdiffusion of materials between the reflective layer and the light emitting structure 120. In addition, it is possible to prevent electric short circuit caused by the metallic material remaining in other regions, in which the second contact electrodes 140 are not formed, during formation of the reflective layer including the metallic material.

Figure 6A:
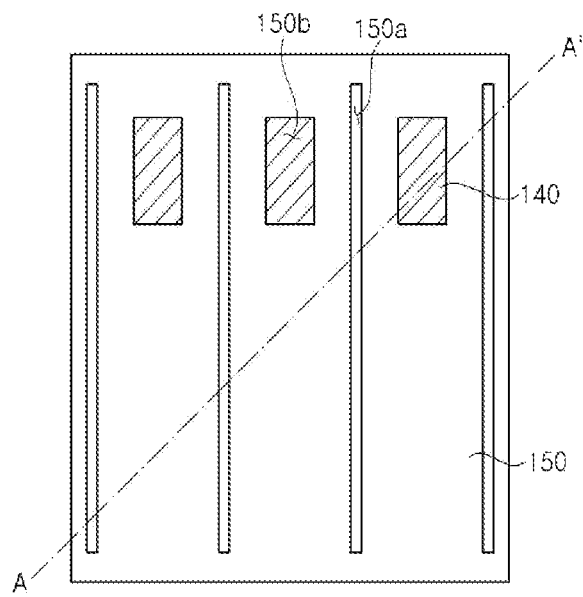
Figure 6B:
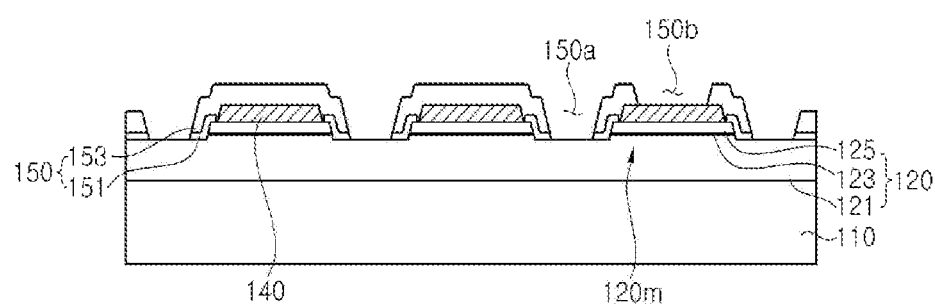

Next, referring to FIG. 6A and FIG. 6B, a main first insulation layer 153 is formed on the pre-first insulation layer 153 and the main first insulation layer 153 and the pre-first insulation layer 153 form the first insulation layer 150. The first insulating layer 150 is formed on the light emitting structure 120 so as to cover parts of the first conductivity type semiconductor layer 121, the mesas 120m and the second contact electrodes 140. In addition, the first insulating layer 150 may include first openings 150a partially exposing the first conductivity type semiconductor layer 121 and second openings 150b partially exposing the second contact electrode 140.

The main first insulating layer 153 may include $SiO_2$, $SiN_x$, $MgF_2$, or others, and may be formed by any deposition process known in the art, such as PECVD, e-beam evaporation, or others. Here, the first insulating layer 150 may be formed by forming the main first insulating layer 153 to cover the entirety of the first conductivity type semiconductor layer 121, the mesas 120m and the second contact electrodes 140, followed by forming the first and second openings 150a, 150b through a patterning process. The patterning process may include a photolithography, etching or lift-off process. The main first insulating layer 153 may have a multilayer structure and may also include a distributed Bragg reflector in which material layers having different indices of refraction are alternately stacked one above another. The main first insulating layer 153 may have a greater thickness than the pre-first insulating layer 151.

The first insulating layer 150 may include at least one first opening 150a, for example, first openings 150a formed on the mesas 120m, respectively. In addition, the first openings 150a may be disposed near one side of the growth substrate 110. The second openings 150b may have an elongated shape extending in an extension direction of the mesas 120m. Particularly, the second openings 150b may be formed near long sides of the mesas 120m.

Although the second contact electrodes 140 are formed after formation of the mesas 120m in this exemplary embodiment, the second contact electrodes 140 may be formed before formation of the mesas 120m in other exemplary embodiments.

Figure 7A:
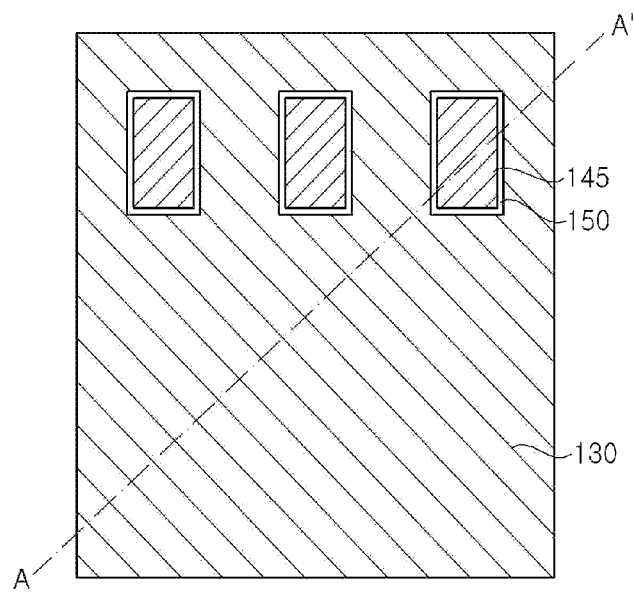
Figure 7B:
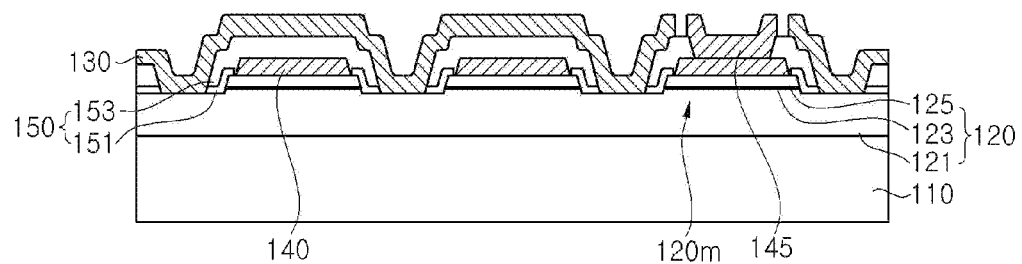

Next, referring to FIG. 7A and FIG. 7B, the first contact electrode 130 is formed on the first insulating layer 150. The first contact electrode 130 may form ohmic contact with the first conductivity type semiconductor layer 121 exposed through the first openings 150a. Further, connection electrodes 145 may be formed to electrically contact the second contact electrodes 140 through the second openings 150b.

The first contact electrode 130 and the connection electrodes 145 may be formed through any deposition and patterning processes known in the art, and may be formed at the same time or by different processes. The first contact electrode 130 and the connection electrodes 145 may be formed of or include the same material and have a multilayer structure or may be formed of different materials and/or have a multilayer structure. The first contact electrode 130 is spaced apart from the connection electrodes 145 and thus is electrically insulated from the second contact electrodes 140.

As described above, the first contact electrode 130 may form ohmic contact with the first conductivity type semiconductor layer 121 and may serve to reflect light. Accordingly, the first contact electrode 130 may include a highly reflective layer, such as an Al layer. Here, the first contact electrode 130 may be composed of a single layer or multiple layers. The highly reflective metal layer may be formed on a bonding layer such as a Ti, Cr or Ni layer. Alternatively, the first contact electrode 130 may include at least one of Ni, Pt, Pd, Rh, W, Ti, Al, Mg, Ag or Au. The connection electrodes 145 may include at least one of, for example, Ni, Pt, Pd, Rh, W, Ti, Al, Mg, Ag or Au.

For example, each of the first contact electrode 130 and/or the connection electrode 145 may include a multilayer structure. The multilayer structure may have a stacked structure including first bonding layer (ohmic contact layer)/reflective layer/barrier layer/anti-oxidation layer/bonding layer. The first contact layer may contact the first conductivity type semiconductor layer 121 and/or the second contact electrodes 140 and may include Ni, Ti, Cr, or others. The reflective layer may include a metal having high reflectivity, for example, Al, Ag, or others. The barrier layer prevents interdiffusion of metals of the reflective layer, and may be composed of a single layer of Cr, Co, Ni, Pt, or TiN, or multiple layers together with Ti, Mo, or W. For example, the barrier layer may have a multilayer structure of Ti/Ni. The anti-oxidation layer prevents oxidation of other layers disposed under the anti-oxidation layer and may include a metallic material highly resistant to oxidation. The anti-oxidation layer may include, for example, Au, Pt, Ag, or others. The second bonding layer may be employed to enhance adhesion between a second insulating layer 160 and the first conductivity type semiconductor layer 121 (or between the second insulating layer 160 and the connection electrode 145), and may include, for example, Ti, Ni, Cr, or others. However, it should be understood that other implementations are also possible.

Figure 8A:
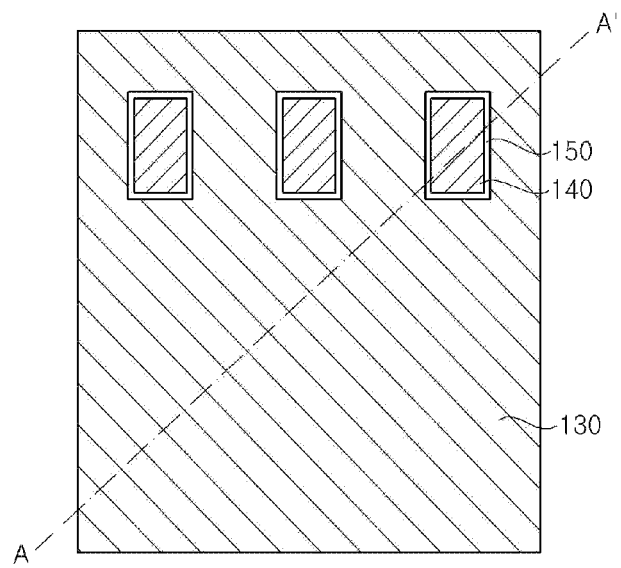
Figure 8B:
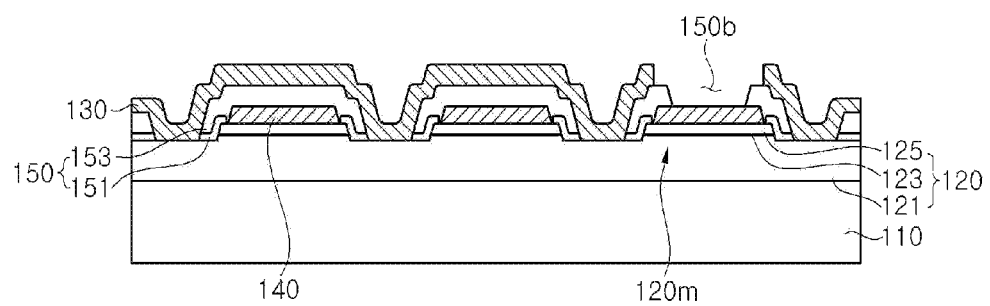

Alternatively, the connection electrodes 145 may be omitted. Referring to FIG. 8A and FIG. 8B, in exemplary embodiments wherein the connection electrodes 145 are omitted, the second contact electrodes 140 are exposed through the second openings 150b. Accordingly, a second bulk electrode 173 may directly contact the second contact electrodes 140.

Figure 9A:
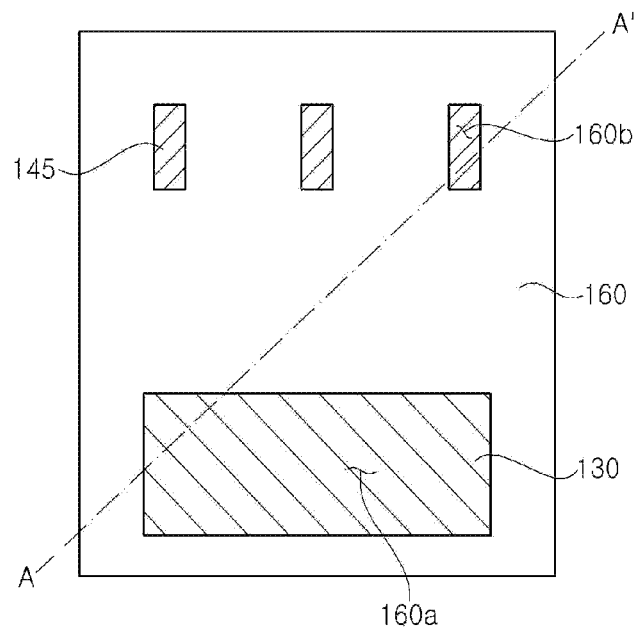
Figure 9B:
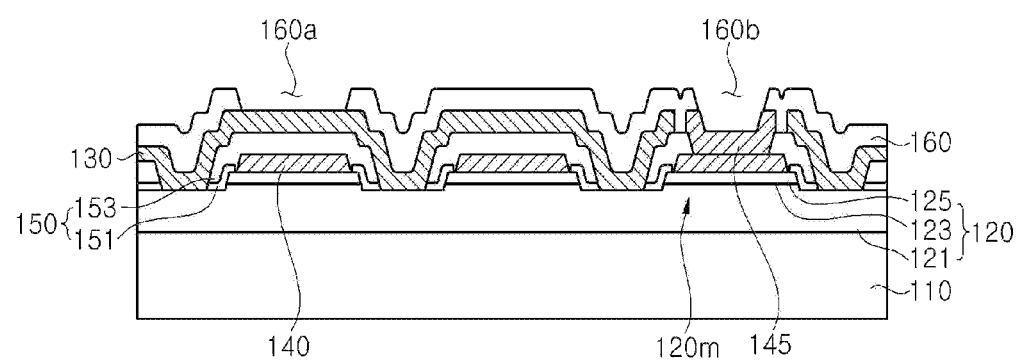

Next, referring to FIG. 9A and FIG. 9B, a second insulating layer 160 is formed to cover parts of the first contact electrode 130 and the connection electrodes 145. The second insulating layer 160 may include a third opening 160a and fourth openings 160b that expose the first contact electrode 130 and the connection electrodes 145, respectively.

The second insulating layer 160 may include $SiO_2$, $SiN_x$, $MgF_2$, or others, and may be formed by any deposition process known in the art, such as PECVD, e-beam evaporation, or others. Here, the second insulating layer 160 may be formed to cover the entirety of the first contact electrode 130 and the connection electrodes 145, followed by forming the third and fourth openings 160a, 160b through a patterning process. The patterning process may include a photolithography, etching or lift-off process. The second insulating layer 160 may include a multilayer structure and may include a distributed Bragg reflector in which material layers having different indices of refraction are alternately stacked one above another. The uppermost layer of the second insulating layer 160 may be formed of or include $SiN_x$. With the structure wherein the uppermost layer of the second insulating layer 160 is formed of or includes $SiN_x$, the light emitting diode can more effectively prevent moisture from entering the light emitting structure 120. In addition, the second insulating layer 160 may have a smaller thickness than the first insulating layer 150, for example, a thickness of about 0.8 μm or more in order to secure insulation resistance. However, it should be understood that other implementations are also possible.

The third and fourth openings 160a, 160b expose the first contact electrode 130 and the connection electrodes 145, respectively, thereby providing a passage through which the bulk electrodes 171, 173 can be electrically connected to the first contact electrode 130 and the second contact electrodes 140, respectively.

Figure 10A:
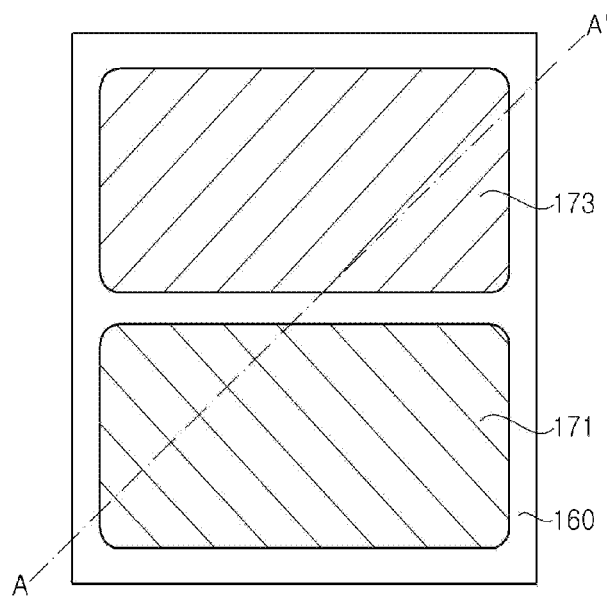
Figure 10B:
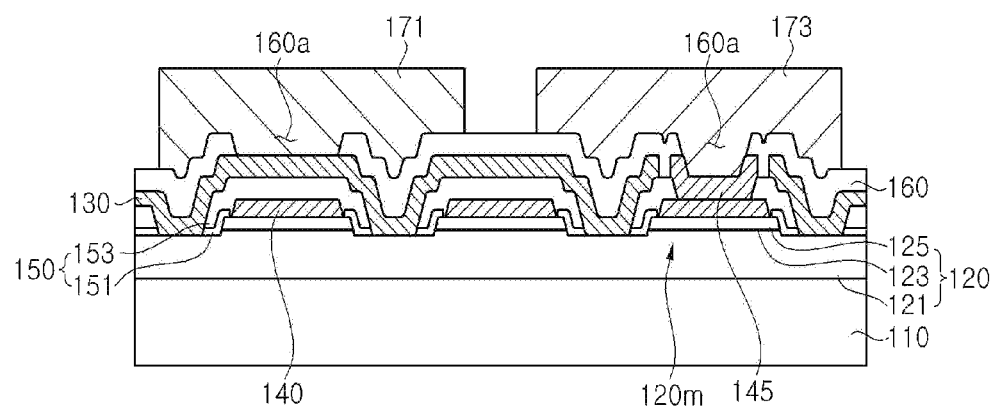

Referring to FIG. 10A and FIG. 10B, a first bulk electrode 171 and a second bulk electrode 173 are formed on the second insulating layer 160.

The first pad electrode 171 may be connected to the first contact electrode 130 through the third opening 160a of the second insulating layer 160, and the second pad electrode 173 may be connected to the second contact electrodes 140 through the fourth openings 160b of the second insulating layer 160. The first pad electrode 171 and the second pad electrode 173 may be used as pads for connection of bumps or for surface-mount technology (SMT) to mount the light emitting diode on a submount, a package or a printed circuit board.

The first pad electrode 171 and the second pad electrode 173 may be formed by the same process, for example, photolithography and etching or a lift-off process. Each of the first pad electrode 171 and the second pad electrode 173 may include, for example, a bonding layer of Ti, Cr or Ni or a highly conductive metal layer of Al, Cu, Ag or Au.

Then, the growth substrate 110 is divided into unit diode regions UDI, thereby completing fabrication of light emitting diodes. The growth substrate 110 may be removed from the light emitting diodes before or after dividing into the unit diode regions UDI.

FIG. 11 to FIG. 17 are views illustrating an SMT process for mounting a light emitting diode on a substrate.

Figure 11:
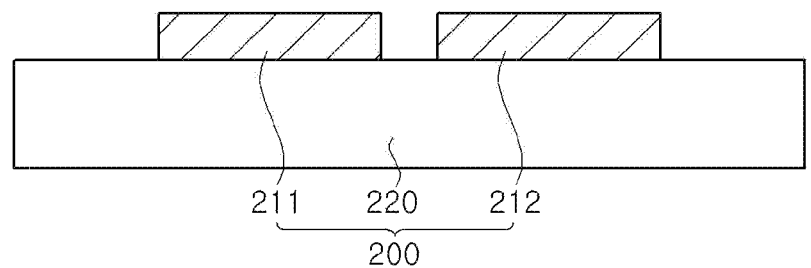
Figure 12A:
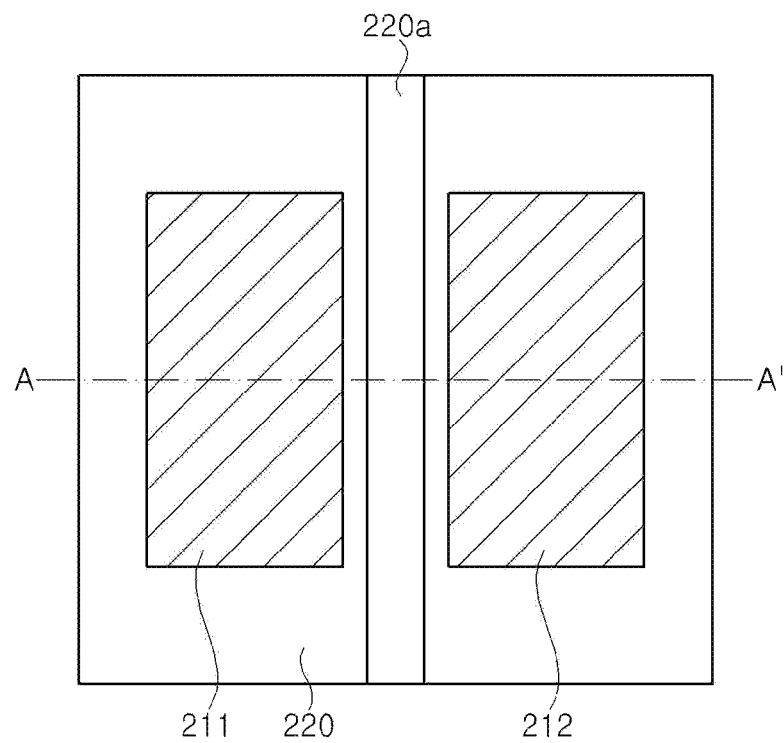
Figure 12B:
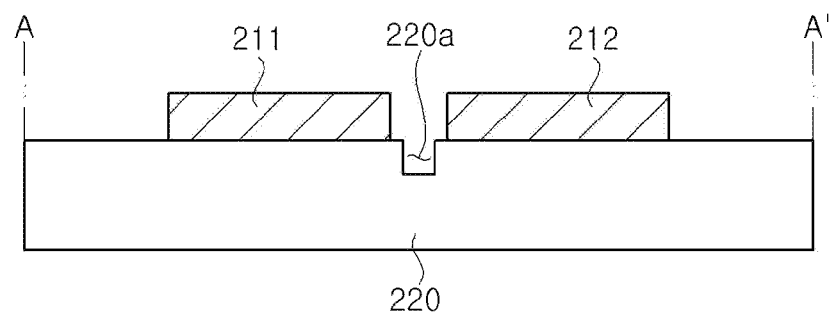
Figure 13A:
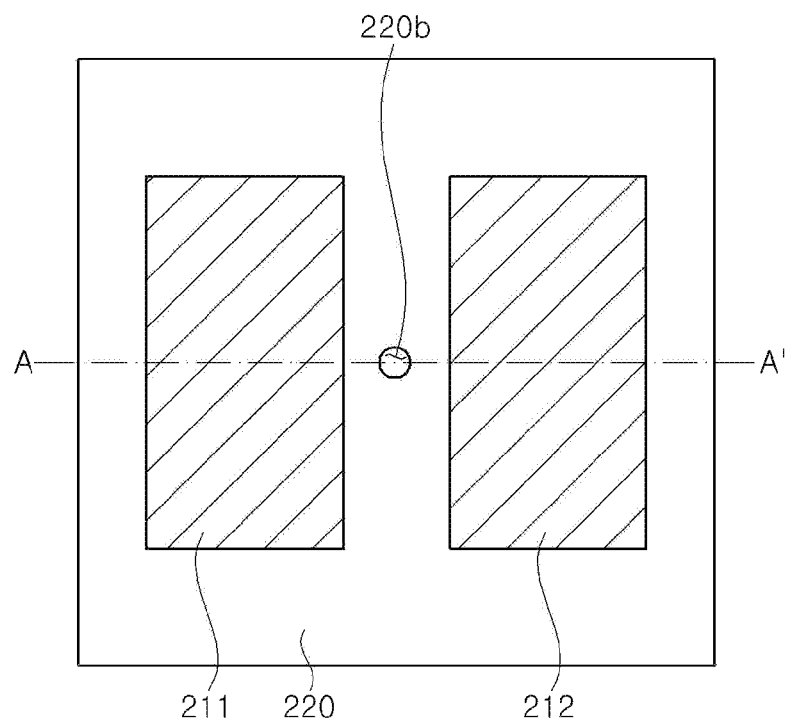
Figure 13B:
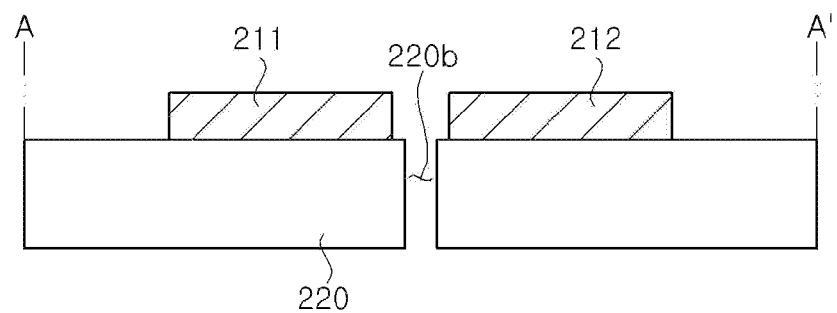
Figure 14A:
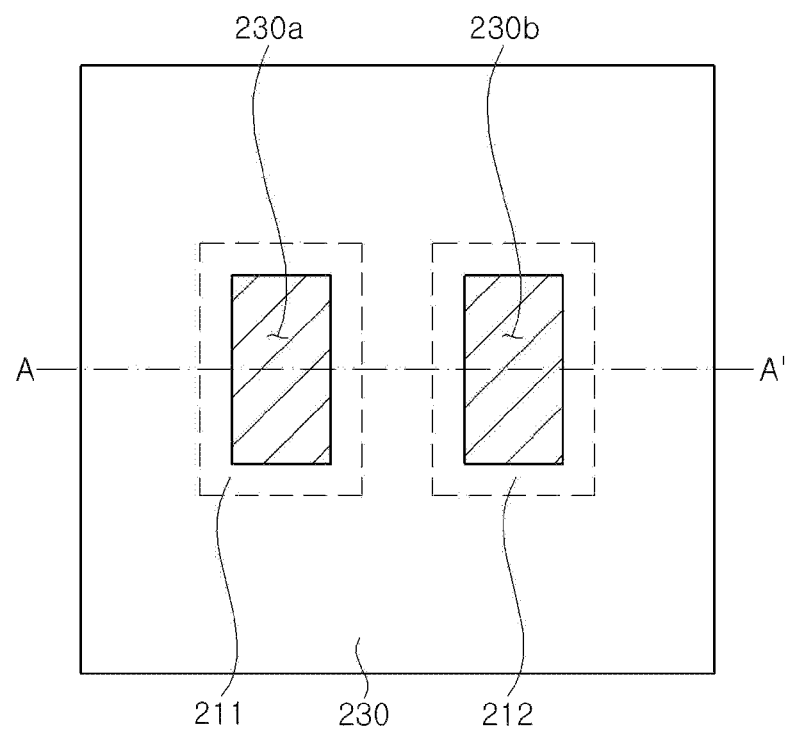
Figure 14B:
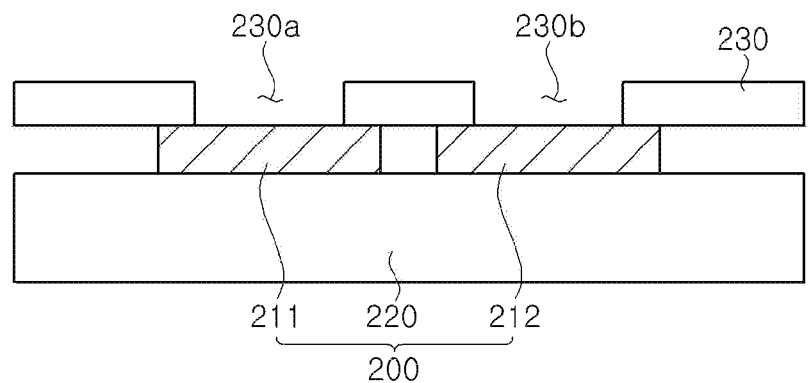

Referring to FIG. 11, a substrate 200 including a first connection pad 211, a second connection pad 212, and a base 220 is prepared.

The first connection pad 211 may be electrically connected to the first pad electrode 171 and the second connection pad 212 may be electrically connected to the second pad electrode 173. The first connection pad 211 and the second connection pad 212 may be disposed on the base 220 of the substrate 200. The first connection pad 211 and the second connection pad 212 may include a material having high electrical conductivity, for example, Cu, Au, Ag, Pt, Al, or others. The base 220 of the substrate 200 may include a ceramic material and may include a metallic material in order to improve heat dissipation of a light emitting device.

Alternatively, referring to FIGS. 12 A and 12B, the substrate 200 may further include a groove 200a between the first connection pad 211 and the second connection pad 212. For example, as shown in FIGS. 12 A and 12B, the groove 220a is formed on an upper surface of the base 220 of the substrate 200 to be disposed between the first connection pad 211 and the second connection pad 212. The groove 220a may be formed by partially indenting the upper surface of the base 220. The groove 220a may be parallel to the first connection pad 211 and the second connection pad 212 and extend not only under a region on which the light emitting diode is mounted, but also to other regions. Generally, when solders are disposed between the first connection pad 211 and the second connection pad 212, a space for removing solvents containing a conductive material in the solders 301, 302 is not secured, thereby causing short circuit of the light emitting diode package. In this exemplary embodiment, however, the groove 220a provides a passage through which flux in the solders moves to the groove 220a, thereby reducing the amount of the flux of the solders disposed between the first connection pad 211 and the second connection pad 212. Accordingly, short circuit of the light emitting diode package can be prevented by securing the space for removing solvents, thereby reducing the failure rate of the light emitting diode package.

Referring to FIGS. 13 A and 13B, the substrate 200 may further include at least one hole 220b disposed between the first connection pad 211 and the second connection pad 212. For example, as shown in FIGS. 13 A and 13B, the hole 220b may be formed through the substrate 200 and pass from the upper surface of the base 220 to a lower surface of the base 220. With this structure, the flux can escape through the hole 220b, thereby reducing the amount of the flux of the solders disposed between the first connection pad 211 and the second connection pad 212. In this way, short circuit of the light emitting diode package can be prevented by securing the space for removing solvents, thereby reducing the failure rate of the light emitting diode package.

Referring to FIGS. 14 A and 14B, a mask 230 is disposed on the substrate 200. The mask 230 may be or include a metal mask and may include Ni, without being limited thereto. Alternatively, the mask may be or include an SUS mask or a polyimide mask. The mask 230 may contact at least part of the base 220, the first connection pad 211 and the second connection pad 212. The mask 230 serves to define locations of the solders 301, 302.

The mask 230 may include a first exposure region 230a and a second exposure region 230b. The first exposure region 230a and the second exposure region 230b define regions in which the first solder 301 and the second solder 302 will be placed, respectively. The first exposure region 230a and the second exposure region 230b may be placed on the first connection pad 211 and the second connection pad 212, respectively. The centers of the first exposure region 230a and the second exposure region 230b may overlap the centers of upper surfaces of the first connection pad 211 and the second connection pad 212 in the vertical direction, respectively. This structure can minimize deviation of the solders 301, 302 from the upper surfaces of the connection pads 211, 212 to reduce the possibility of short circuit, thereby enabling stable mounting of the light emitting diode.

The first exposure region 230a and the second exposure region 230b will be described in more detail.

Figure 15:
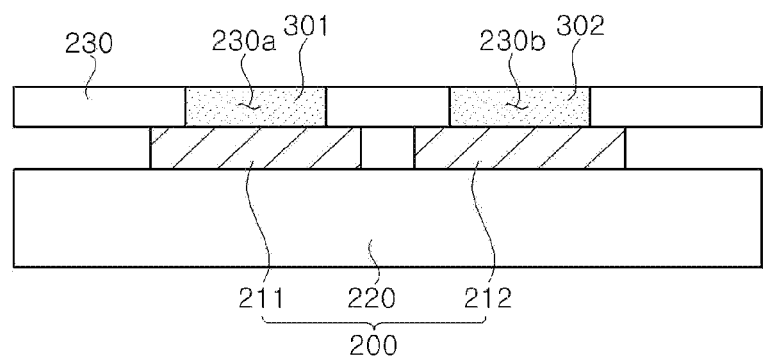

Referring to FIG. 15, the solders 301, 302 are placed on the first connection pad 211 and the second connection pad 212. The solders 301, 302 may include a solvent containing a flux and conductive materials such as tin (Sn), silver (Ag), copper (Cu), or others. The solvent may further include lead (Pb). The solders may include a first solder 301 adjoining the first connection pad 211 and a second solder 302 adjoining the second connection pad 212. The first solder 301 and the second solder 302 may be formed in the first exposure region 230a and the second exposure region 230b, respectively. After the first solder 301 and second solder 302 are disposed, the mask 230 may be removed.

Figure 16:
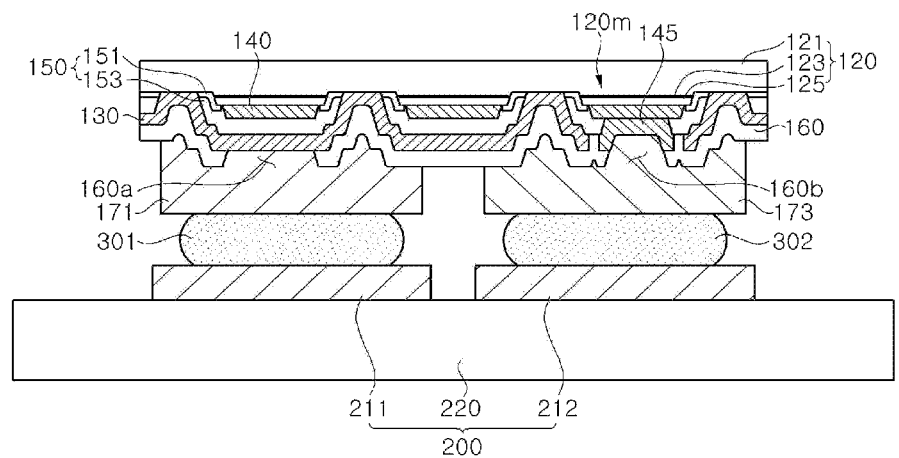

Referring to FIG. 16, a light emitting diode may be mounted on the substrate 200. Specifically, the first pad electrode 171 and the second pad electrode 173 may be placed on the first solder 301 and the second solder 302, respectively. Accordingly, the first pad electrode 171 and the second pad electrode 173 may be electrically connected to the first connection pad 211 and the second connection pad 212, respectively.

Figure 17:
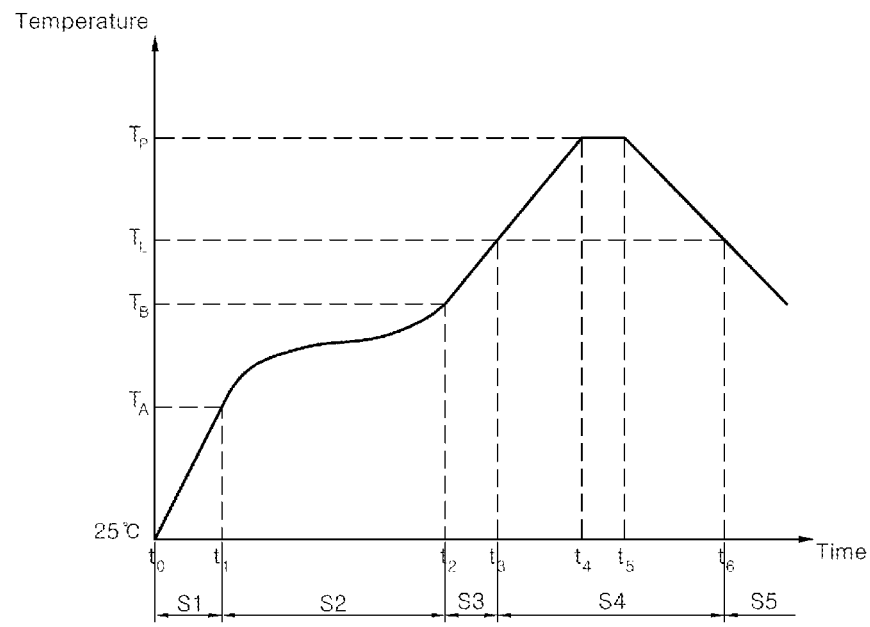

Thereafter, the solders 301, 302 are subjected to heat treatment (reflow process). FIG. 17 is a graph depicting heat treatment with respect to the solders. Heat treatment of the solders may include: heating the solders from room temperature (25 degrees Celsius) to a temperature $T_p$ for a period of time from $t_0$ to $t_4$; maintaining the solders at the temperature $T_p$ for a period of time from $t_4$ to $t_5$; and cooling the solders after $t_5$. The temperature $T_p$ may be 300 degrees Celsius or less. If the temperature $T_p$ exceeds 300 degrees Celsius, Al in the first contact electrode 130 or the second contact electrode 140 can be oxidized, thereby deteriorating output of the light emitting diode package.

Specifically, the heating step may be performed for suitable time period, for example, 8 minutes or less. The heating step may include a first ramping step S1, a preheating step S2, and a second ramping step S3. The first ramping step S1 is a process of raising the temperature of the solders from room temperature to a temperature $T_A$ for a period of time from $t_0$ to $t_1$ and the second ramping step S3 is a process of raising the temperature of the solders from a temperature $T_B$ to a temperature $T_L$ for a period of time from t2 to t3 at a constant heating rate. $T_A$ may be about 150 degrees Celsius and $T_B$ may be about 200 degrees Celsius.

The preheating step S2 is a process of raising the temperature of the solders from a temperature $T_A$ to a temperature $T_B$ for a period of time from $t_1$ to $t_2$, for example, from about 150 degrees Celsius to about 200 degrees Celsius in a period of time from 60 seconds to 180 seconds. The preheating step S2 may include a time zone in which the temperature is increased at a constant heating rate, and may include a preheating zone in which the heating rate varies over time, as shown in FIG. 17. Flowability can be imparted to the solders through the preheating step S2.

Soldering S4 may be performed for a period of time from $t_3$ to $t_6$. The solders are melted to have increased adhesion by soldering S4, and bonding locations between the solders and the first and second pad electrodes 171, 173 may be determined. Soldering S4 may be performed for 60 seconds to 150 seconds. Soldering S4 may include part of the heating step, the maintaining step, and the cooling step. In the heating step, soldering S4 may be performed for a period of time from t3 to t4 such that the temperature of the solders is raised from the temperature $T_L$ to the temperature $T_p$. For example, the temperature $T_L$ may be about 217 degrees Celsius and the temperature Tp may be about 260 degrees Celsius. Here, the heating rate may be 3° C./s or less. As a result, the solders are melted to exhibit adhesion. In the maintaining step, soldering S4 may be performed for a period of time from t4 to t5, for example, for 20 seconds to 40 seconds. In the cooling step, soldering S4 may be performed for a period of time from t5 to t6. In this stage, the temperature is lowered at a rate of 6° C./s or less.

The method may further include cooling S5 after soldering (after t6) and the temperature is lowered at a rate of 6° C./s or less in this cooling step.

In the surface-mount process described with reference to FIG. 11 to FIG. 17, the failure rate can vary depending on conditions such as the width of the exposed regions 230a, 230b of the mask 230, the mask thickness, the amount of the solders 301, 302, the Ag content in the solders 301, 302, the soldering time, etc. FIG. 18 to FIG. 21 are graphs depicting a failure rate of a light emitting diode package according to exemplary embodiments depending upon such conditions. In each drawing, "A" is a graph depicting a failure rate of the light emitting diode package when heat treatment of the solders was performed once after mounting the light emitting diode therein and "B" is a graph depicting a failure rate of the light emitting diode package when heat treatment of the solders was additionally performed three times under the same conditions after heat treatment was performed once. When plural light emitting diodes are sequentially mounted on the substrate 200, heat treatment can be performed a plurality of times and "B" represents the failure rate in this case. Each experiment was repeated in the same way for 5000 light emitting diodes. Each figure includes a graph according to the regression equation derived by conducting several experiments for each of the conditions.

Next, the failure rate of the light emitting diode package according to the exemplary embodiment depending upon the conditions will be described with reference to FIGS. 18A. 18B. 19A, 19B, 20A, 20B and 21.

Figure 18A:
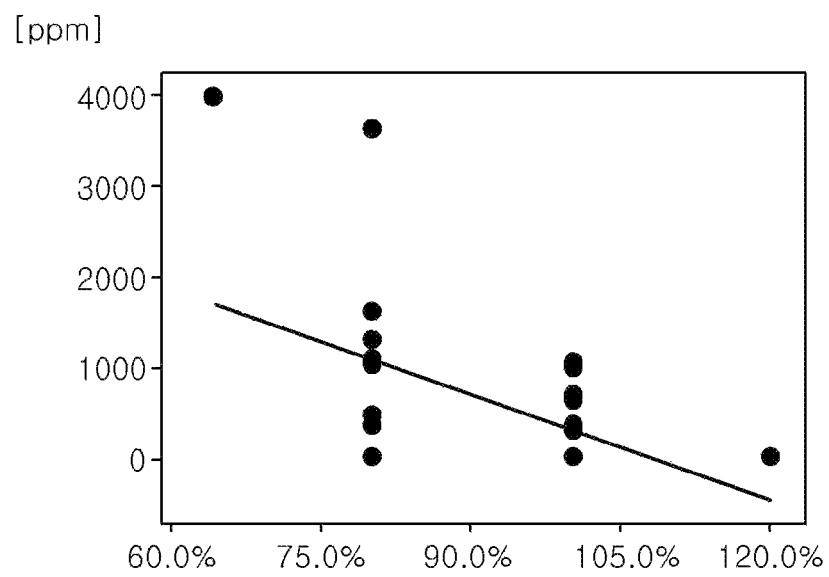
FIGS. 18A, 18B, 19A, 19B, 20A, 20B and 21 are graphs depicting a failure rate of a light emitting diode package manufactured by the manufacturing method according to the exemplary embodiment disclosed in the present document.
Figure 18B:
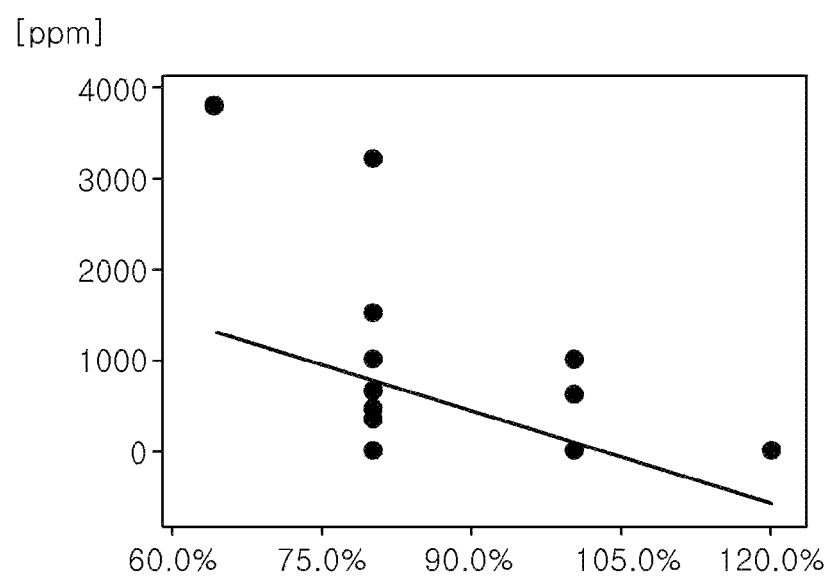

FIGS. 18A and 18B are graphs depicting the failure rate of the light emitting diode package depending upon area of each of the exposed regions 230a, 230b of the mask 230. In FIGS. 18A and 18B, the areas of the first exposure region 230a and the second exposure region 230b are expressed in percent based on the upper surface areas of the first connection pad 211 and the second connection pad 212, respectively. The areas of the first exposure region 230a and the second exposure region 230b may be 80% or more of the upper surface areas of the first connection pad 211 and the second connection pad 212, respectively. Referring to FIG. 18A, when the areas of the first exposure region 230a and the second exposure region 230b are 80% or more of the upper surface areas of the first connection pad 211 and the second connection pad 212, respectively, the light emitting diode package has a failure rate of 1,000 ppm or less. In addition, when the areas of the first exposure region 230a and the second exposure region 230b are 100% to 110% of the upper surface areas of the first connection pad 211 and the second connection pad 212, respectively, the light emitting diode package has a failure rate of 500 ppm or less. As can be seen from FIG. 18B, when each of the exposed regions 230a, 230b has an area within this range, the effect of reducing the failure rate is the same even after heat treatment is performed a plurality of times. Although not necessarily caused by the following reasons, when the area of each of the first exposure region 230a and the second exposure region 230b falls within this range, the thickness of the solders 301, 302 can be sufficiently increased by heat treatment after mounting the solders 301, 302, thereby providing a sufficient space between the solders 301, 302. As a result, the solvent can be easily discharged from the solders 301, 302, thereby reducing the failure rate of the light emitting diode package. Furthermore, since the failure rate of the light emitting diode package is reduced even after heat treatment is performed a plurality of times, the failure rate can be reduced even in a manufacturing process of a light emitting diode package on which a plurality of light emitting diodes is sequentially mounted.

Figure 19A:
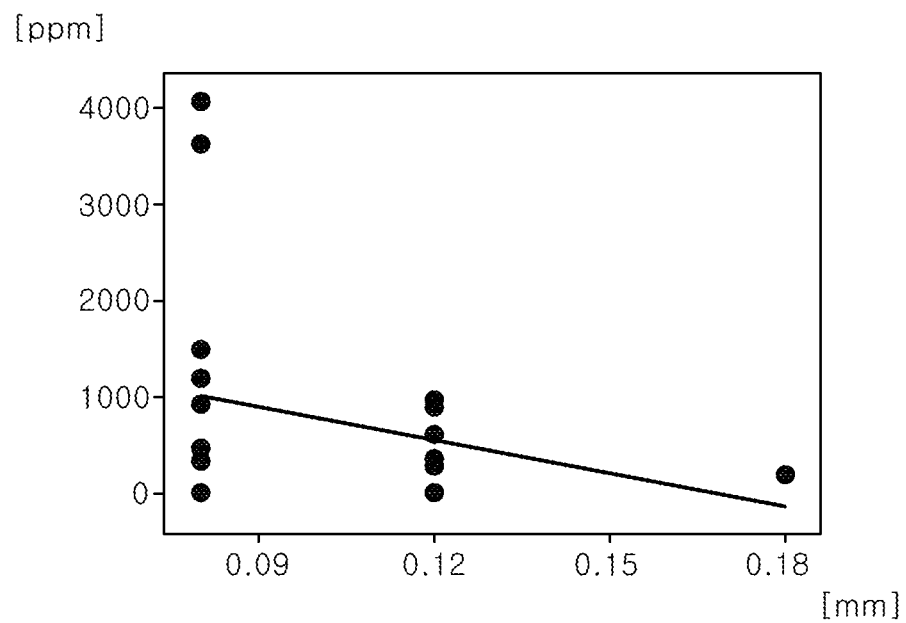
Figure 19B:
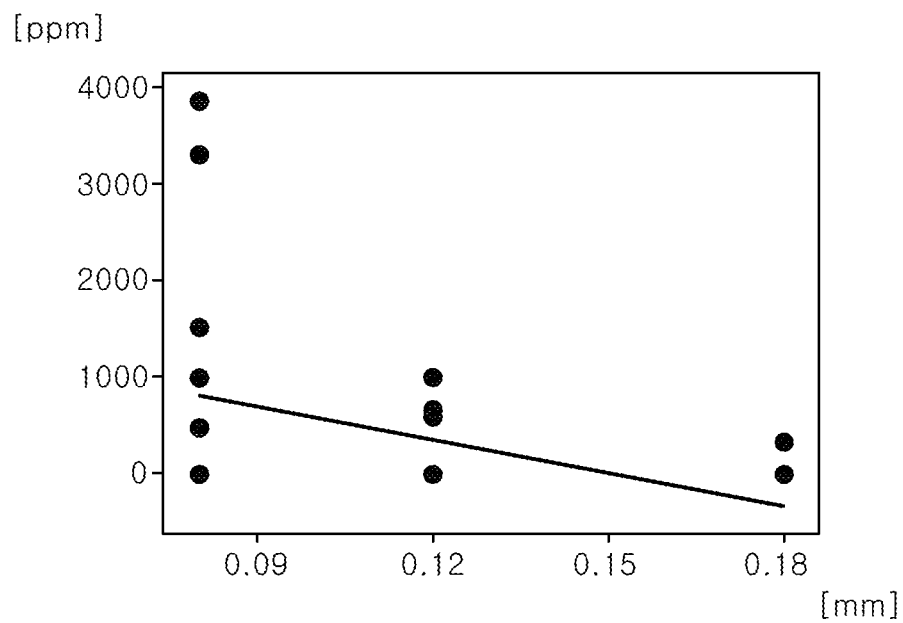

FIGS. 19A and 19B are graphs depicting the failure rate of the light emitting diode package depending upon thickness of the mask 230. The mask 230 may have a thickness of 0.08 mm. Specifically, the thickness of the mask 230 may be a thickness of the mask 230 around the exposed regions 230a, 230b. Referring to FIG. 19A, when the mask 230 has a thickness of 0.08 mm, the light emitting diode package may have a failure rate of 1,000 ppm or less. Furthermore, when the mask 230 has a thickness of 0.12 mm to 0.18 mm, the light emitting diode package may have a failure rate of 500 ppm or less. Furthermore, as can be seen from FIG. 19B, when the mask 230 has a thickness within this range, the effect of reducing the failure rate is the same even after the heat treatment is performed a plurality of times. Although not necessarily caused by the following reasons, when the mask 230 has a thickness within this range, the solders 301, 302 can have an increased thickness and can be stably placed, thereby providing a sufficient space between the solders 301, 302. As a result, the solvent can be easily discharged from the solders 301, 302, thereby reducing the failure rate of the light emitting diode package. Furthermore, since the failure rate of the light emitting diode package is reduced even after heat treatment is performed a plurality of times, the failure rate can be reduced even in a manufacturing process of a light emitting diode package on which a plurality of light emitting diodes is sequentially mounted.

Figure 20A:
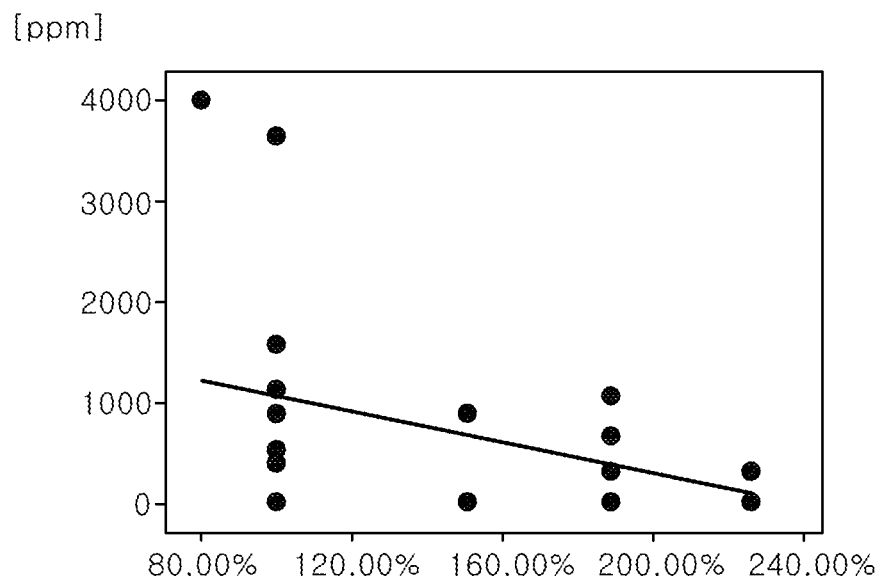
Figure 20B:
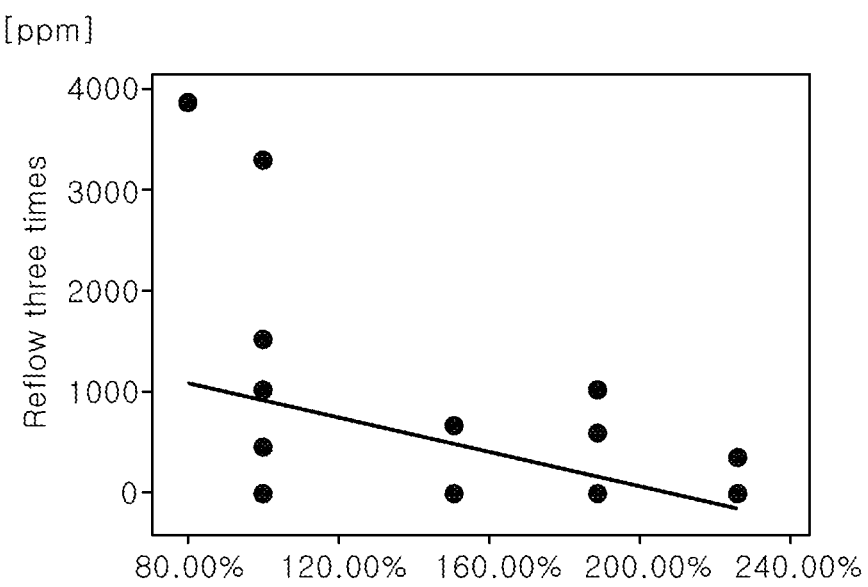

FIGS. 20A and 20B are graphs depicting the failure rate of the light emitting diode package depending upon amount of the solders 301, 302. In FIGS. 20A and 20B, the amount of the solders 301, 302 is expressed in percent based on a reference solder amount. The reference solder amount refers to a volume according to Equation 1.

$$\text{Reference solder amount (mm3)} = (\text{upper surface area of first exposure region (mm2) and upper surface area of second exposure region (mm2)}) \times 0.08 \text{ mm} \quad \text{[Equation 1]}$$

When the amount of the solders 301, 302 is 100% or more of the reference solder amount, the light emitting diode package can have a failure rate of 1,000 ppm or more. Furthermore, when the amount of the solders 301, 302 is 150% to 230% of the reference solder amount, the light emitting diode package can have a failure rate of 500 ppm or less. As can be seen from FIG. 20B, when the amount of the solders 301, 302 falls within this range, the effect of reducing the failure rate is the same even after heat treatment is performed a plurality of times. Although not necessarily caused by the following reasons, when the amount of the solders 301, 302 falls within this range, the solders 301, 302 can have an increased thickness, thereby providing a sufficient space between the first and second solders 301, 302. As a result, the solvent can be easily discharged from the solders 301, 302, thereby reducing the failure rate of the light emitting diode package. Furthermore, since the failure rate of the light emitting diode package is reduced even after heat treatment is performed a plurality of times, the failure rate can be reduced even in a manufacturing process of a light emitting diode package on which a plurality of light emitting diodes is sequentially mounted.

However, an excess of the solders can provide a tilt failure, thereby causing the light emitting diode to be rotated or biased to one side. Accordingly, when the amount of the solders is increased to 230% or more, there can be an increase in failure such as a tilt failure, which can be observed by the naked eye, despite an advantage of preventing short circuit.

Figure 21:
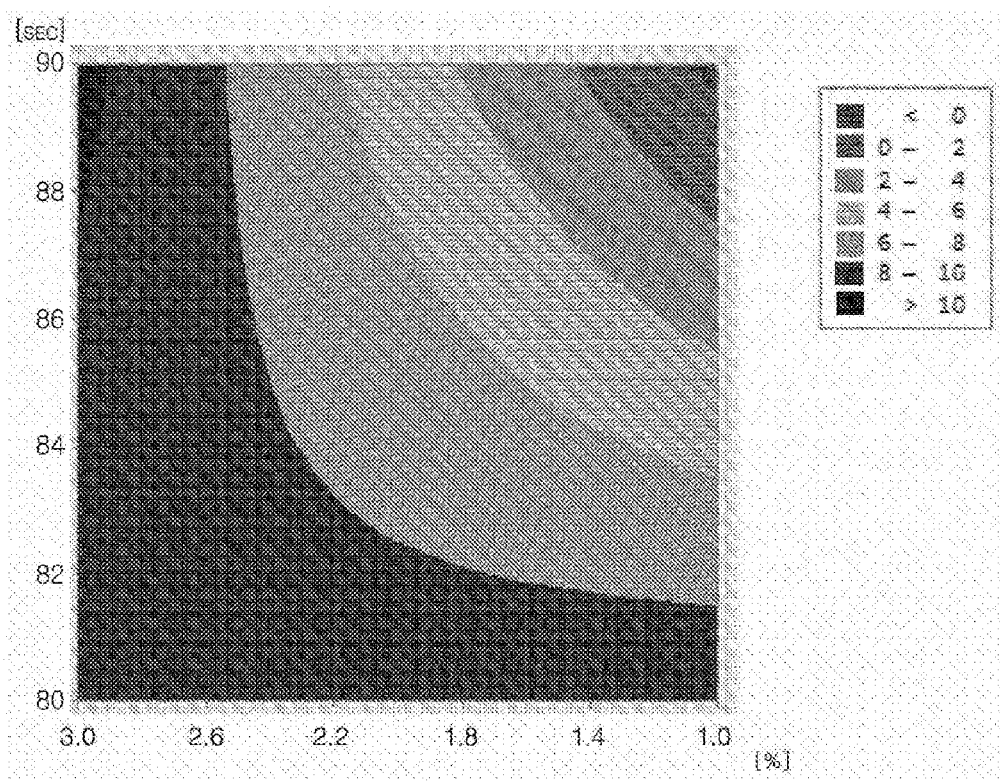

FIG. 21 is a graph depicting the failure rate of the light emitting diode package depending upon the Ag content in the solders and soldering time. In the heat treatment of the solders 301, 302, soldering may be performed at 217 degrees Celsius to 260 degrees Celsius. In addition, soldering may be performed for 88 seconds to 90 seconds. When this time range is satisfied, the solders 301, 302 can be prevented from being excessively melted and deviating from the solder mounting area while ensuring sufficient adhesion. In addition, the Ag content in the solders may range from 1% to 1.4% of the total weight of the solders. The Sn content in the solders may be 90% or more of the total weight of the solders. Referring to FIG. 21, when soldering is performed for 88 seconds to 90 seconds and the Ag content in the solders ranges from 1% to 1.4%, the number of light emitting diode packages having failures can be two or less in an experiment with respect to 5000 light emitting diode packages.

Figure 22:
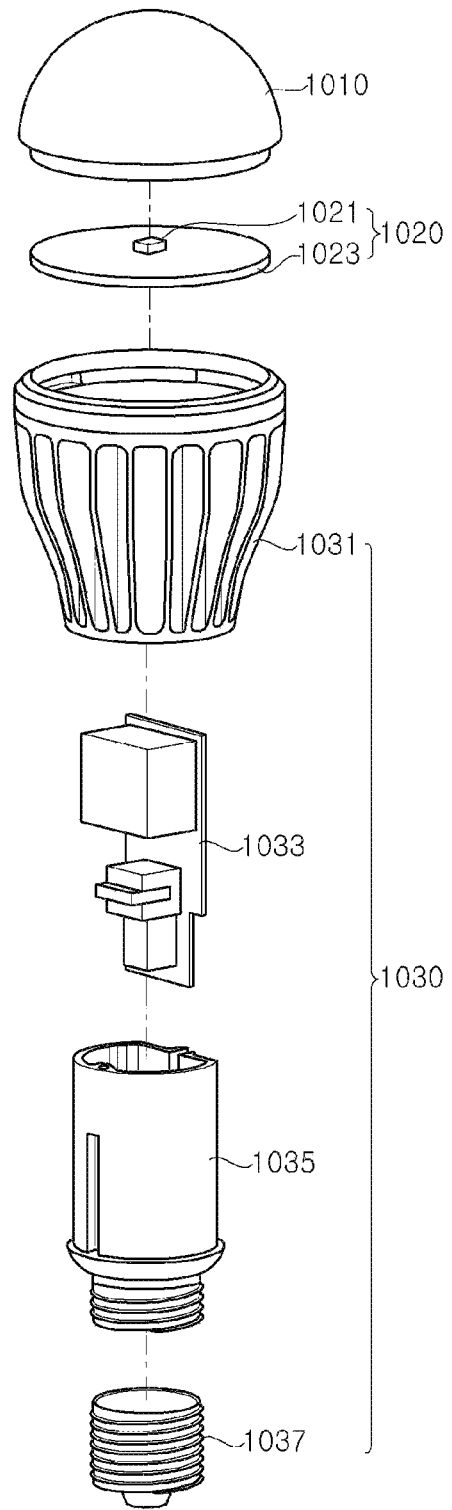
FIG. 22 is an exploded perspective view of one embodiment of a lighting apparatus to which a light emitting diode package manufactured by the manufacturing method according to the exemplary embodiments is applied.

FIG. 22 is an exploded perspective view of one embodiment of a lighting apparatus to which a light emitting diode package manufactured by the manufacturing method according to the exemplary embodiments is applied.

Referring to FIG. 22, the lighting apparatus according to this embodiment includes a diffusive cover 1010, a light emitting diode package module 1020, and a body 1030. The body 1030 may receive the light emitting diode package module 1020 and the diffusive cover 1010 may be disposed on the body 1030 to cover an upper side of the light emitting diode package module 1020.

The body 1030 may have any shape so long as the body can supply electric power to the light emitting diode package module 1020 while receiving and supporting the light emitting diode package module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting diode package module 1020, and may include at least one IC chip. The IC chip may regulate, change or control electric power supplied to the light emitting diode package module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting diode package module 1020 includes a substrate 1023 and a light emitting diode package 1021 disposed on the substrate 1023. The light emitting diode package module 1020 may be disposed at an upper portion of the body case 1031 and electrically connected to the power supply 1033.

As the substrate 1023, any substrate capable of supporting the light emitting diode package 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode package 1021 may include at least one of the light emitting diode packages according to the exemplary embodiments described above.

The diffusive cover 1010 is disposed on the light emitting diode package 1021 and may be secured to the body case 1031 to cover the light emitting diode package 1021. The diffusive cover 1010 may be formed of a light-transmitting material and light orientation of the lighting apparatus may be adjusted through regulation of the shape and optical transmissivity of the diffusive cover 1010. Thus, the diffusive cover 1010 may be modified in various shapes depending on usage and applications of the lighting apparatus.

Figure 23:
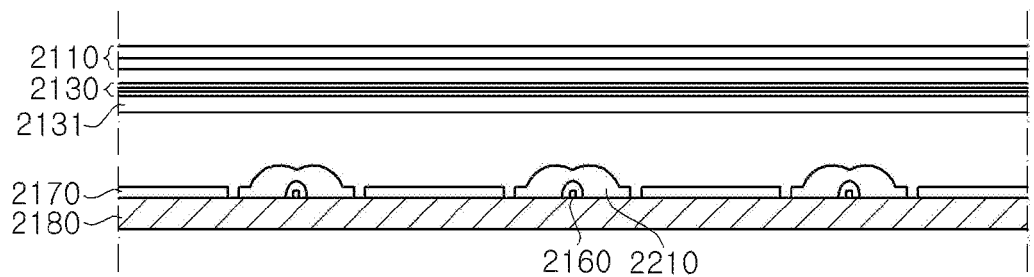
FIG. 23 is a cross-sectional view of one embodiment of a display to which a light emitting diode package manufactured by the manufacturing method according to the exemplary embodiments is applied.

FIG. 23 is a cross-sectional view of one embodiment of a display apparatus to which a light emitting diode package manufactured by the manufacturing method according to the exemplary embodiments is applied.

The display apparatus according to this embodiment includes a display panel 2110, a backlight unit BLU1 supplying light to the display panel 2110, and a panel guide 2100 supporting a lower edge of the display panel 2110.

The display panel 2110 is not particularly limited and may be or include, for example, a liquid crystal panel including a liquid crystal layer. Gate driving PCBs may be further disposed at the periphery of the display panel 2110 to supply driving signals to a gate line. Here, the gate driving PCBs 2112, 2113 may be formed on a thin film transistor substrate instead of being formed on separate PCBs.

The backlight unit BLU1 includes a light source module which includes at least one substrate and a plurality of light emitting diode packages 2160. The backlight unit BLU1 may further include a bottom cover 2180, a reflective sheet 2170, a diffusive plate 2131, and optical sheets 2130.

The bottom cover 2180 may have an opening at an upper side thereof to receive the substrate 2150, the light emitting diode packages 2160, the reflective sheet 2170, the diffusive plate 2131, and the optical sheets 2130. In addition, the bottom cover 2180 may be coupled to the panel guide 2100. The substrate 2150 may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates 2150 may be arranged parallel to one another, without being limited thereto. In some implementations, the backlight unit may include a single substrate 2150.

The light emitting diode packages 2160 may include at least one of the light emitting diode packages according to the exemplary embodiments described above. The light emitting diode packages 2160 may be regularly arranged in a predetermined pattern on the substrate. In addition, a lens 2210 may be disposed on each of the light emitting diode packages 2160 to improve uniformity of light emitted from the plurality of light emitting diode packages 2160.

The diffusive plate 2131 and the optical sheets 2130 are disposed above the light emitting diode packages 2160. Light emitted from the light emitting diode packages 2160 may be supplied in the form of sheet light to the display panel 2110 through the diffusive plate 2131 and the optical sheets 2130.

In this way, the light emitting diode package manufactured by the manufacturing method according to the exemplary embodiments may be applied to direct type displays like the display according to this embodiment.

Figure 24:
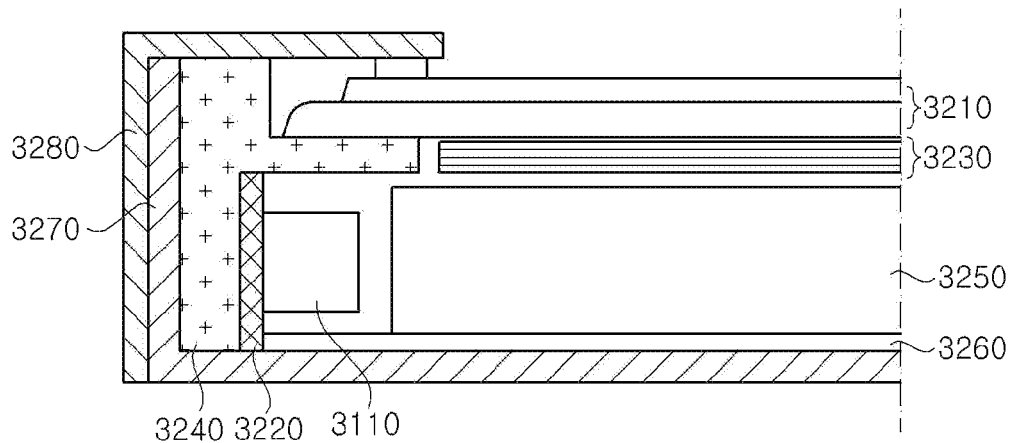
FIG. 24 is a cross-sectional view of another embodiment of the display to which a light emitting diode package manufactured by the manufacturing method according to the exemplary embodiments is applied.

FIG. 24 is a cross-sectional view of another example of the display to which a light emitting diode package manufactured by the manufacturing method according to the exemplary embodiments is applied.

The display apparatus according to this embodiment includes a display panel 3210 on which an image is displayed, and a backlight unit BLU2 disposed at a rear side of the display panel 3210 and emitting light thereto. Further, the display apparatus includes a frame 240 supporting the display panel 3210 and receiving the backlight unit BLU2, and covers 3240, 3280 surrounding the display panel 3210.

The display panel 3210 is not particularly limited and may be or include, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit BLU2.

The backlight unit BLU2 supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit BLU2 according to this embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diode packages 3110 arranged at constant intervals on one surface of the substrate 3220. As the substrate 3220, any substrate capable of supporting the light emitting diode packages 3110 and being electrically connected thereto may be used without limitation. For example, the substrate 3220 may include a printed circuit board. The light emitting diode packages 3110 may include at least one of the light emitting diode packages according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diode packages 3110 into sheet light.

In this way, the light emitting diode package manufactured by the manufacturing method according to the exemplary embodiments may be applied to edge type displays like the display according to this embodiment.

Figure 25:
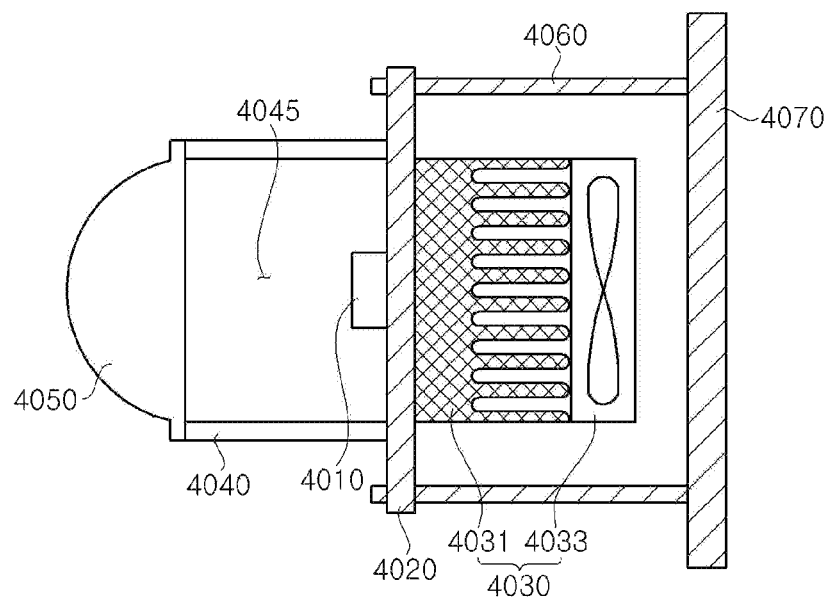
FIG. 25 is a cross-sectional view of one embodiment of a headlight to which a light emitting diode package manufactured by the manufacturing method according to the exemplary embodiments is applied.

FIG. 25 is a cross-sectional view of one embodiment of a headlight to which a light emitting diode package manufactured by the manufacturing method according to the exemplary embodiments is applied.

Referring to FIG. 25, the headlight according to this embodiment includes a lamp body 4070, a substrate 4020, a light emitting diode package 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting diode package 4010 may be used without limitation. For example, the substrate 4020 may include a substrate having a conductive pattern, such as a printed circuit board. The light emitting diode package 4010 is disposed on the substrate 4020 and may be supported and secured by the substrate 4020. In addition, the light emitting diode package 4010 may be electrically connected to an external power source through the conductive pattern of the substrate 4020. Further, the light emitting diode package 4010 may include at least one of the light emitting diode packages according to the exemplary embodiments described above.

The cover lens 4050 is disposed on a path of light emitted from the light emitting diode package 4010. For example, as shown in the drawing, the cover lens 4050 may be spaced apart from the light emitting diode package 4010 by the connection member 4040 and may be disposed in a direction so as to supply light emitted from the light emitting diode package 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode package 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting diode package 4010.

In this way, the light emitting diode package manufactured by the manufacturing method according to the exemplary embodiments may be applied to headlights, particularly, headlights for vehicles, like the headlight according to this embodiment.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A method of manufacturing a light emitting diode package, comprising: disposing a first solder between a first connection pad of a substrate and a first pad electrode of a light emitting diode and disposing a second solder between a second connection pad of the substrate and a second pad electrode of the light emitting diode; and performing heat treatment on the first and second solders to bond the substrate to the light emitting diode, wherein the heat treatment of the first and second solders comprises: heating the first and second solders from room temperature to a temperature $T_P$; maintaining the first and second solders at the temperature $T_P$; and cooling the first and second solders from the temperature $T_P$, and wherein heating the first and second solders comprises: a first ramping step in which a temperature of the first and second solders is raised from room temperature to a temperature $T_A$ at a constant heating rate; a preheating step in which the temperature of the first and second solders is raised from the temperature $T_A$ to a temperature $T_B$ to impart flowability to the first and second solders, wherein the preheating step comprises a preheating zone in which a heating rate varies over time; and a second ramping step in which the temperature of the first and second solders is raised from the temperature $T_B$ to a temperature $T_L$ at a constant heating rate, the preheating step being performed for 60 seconds to 180 seconds.

2. The method of claim 1, wherein, in the preheating step, the temperature is raised within a temperature range of 150 degrees Celsius to 200 degrees Celsius.

3. The method of claim 2, wherein the temperature Tp is 300 degrees Celsius or less.

4. The method of claim 1, further comprising:
soldering the first and second solders to impart adhesion to the first and second solders after the second ramping step,
wherein soldering the first and second solders is performed in the step of raising the temperature of the first and second solders from the temperature $T_L$ to the temperature $T_P$, in the step of maintaining the first and second solders at the temperature Tp, and in the step of cooling the first and second solders.

5. The method of claim 4, wherein, in the step of raising the temperature of the first and second solders from the temperature $T_L$ to the temperature $T_P$, the temperature of the first and second solders is raised at a rate of 3° C./s or less, and, in the step of cooling the first and second solders, the temperature of the first and second solders is lowered at a rate of 6° C./s or less upon soldering the first and second solders.

6. The method of claim 4, wherein soldering the first and second solders is performed in a temperature range of 217 degrees Celsius to 260 degrees Celsius for 88 seconds to 90 seconds.

7. The method of claim 6, wherein each of the first and second solders comprises Ag with concentration 1% to 1.4% based on the total mass of the first solder and the second solder.

8. The method of claim 1, wherein the heating of the first and second solders is performed within 8 minutes or less.

9. The method of claim 1, wherein disposing the first solder and the second solder comprises:
- disposing a mask having a first exposure region and a second exposure region exposing the first connection pad and the second connection pad on the substrate, respectively; and
- disposing the first and second solders in the first exposure region and the second exposure region of the mask, respectively.

10. The method of claim 9, wherein the mask has a thickness of 0.08 mm to 0.18 mm.

11. The method of claim 9, wherein each of the first exposure region and the second exposure region has an area of 80% to 110% of an upper surface area of each of the first connection pad and the second connection pad.

12. The method of claim 9, wherein a center of each of the first exposure region and the second exposure region overlaps a center of each of the first connection pad and the second connection pad in a vertical direction.

13. The method of claim 9, wherein an amount of each of the first solder and the second solder is 100% to 150% of a reference solder amount, the reference solder amount being a volume according to Reference solder amount $(mm^3)$= (upper surface area of first exposure region $(mm^2)$ and upper surface area of second exposure region $(mm^2)$)×0.08 mm.

14. The method of claim 1, wherein the substrate comprises a groove disposed between the first connection pad and the second connection pad to be parallel to the first connection pad and the second connection pad, the groove being formed by partially indenting an upper surface of the substrate.

15. The method of claim 1, wherein the substrate comprises at least one hole disposed between the first connection pad and the second connection pad and formed through the substrate to pass from an upper surface of the substrate to a lower surface thereof.

16. The method of claim 1, further comprising: manufacturing a light emitting diode to include the first pad electrode and the second pad electrode, the manufacturing of the light emitting diode comprising:
- forming a light emitting structure on a growth substrate, the light emitting structure comprising a first conductivity type semiconductor layer, a second conductivity type semiconductor layer, and an active layer interposed between the first conductivity type semiconductor layer and the second conductivity type semiconductor layer;
- forming a first contact electrode and a second contact electrode to form ohmic contact with the first conductivity type semiconductor layer and the second conductivity type semiconductor layer, respectively;
- forming an insulation layer insulating the first contact electrode and the second contact electrode from each other while partially covering the first contact electrode and the second contact electrode; and
- forming a first pad electrode and a second pad electrode on the insulation layer to be electrically connected to the first contact electrode and the second contact electrode, respectively.

17. The method of claim 16, wherein the second contact electrode comprises Ag.

* * * * *